US006970122B1

(12) United States Patent
Yilmaz et al.

(10) Patent No.: US 6,970,122 B1
(45) Date of Patent: Nov. 29, 2005

(54) INTEGRAL NONLINEARITY ERROR CORRECTION FOR INTERPOLATING STRING DAC

(75) Inventors: Abdullah Yilmaz, Tucson, AZ (US); Jerry Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 64 days.

(21) Appl. No.: 10/912,524

(22) Filed: Aug. 5, 2004

(51) Int. Cl.$^7$ .............................................. H03M 1/66
(52) U.S. Cl. ...................................... 341/145; 341/144
(58) Field of Search ................................ 341/145, 144

(56) References Cited

U.S. PATENT DOCUMENTS

| | | | | |
|---|---|---|---|---|
| 6,246,351 B1 | | 6/2001 | Yilmaz ........................ | 341/145 |
| 6,414,616 B1 | * | 7/2002 | Dempsey ..................... | 341/144 |
| 6,496,133 B1 | * | 12/2002 | Yilmaz ........................ | 341/154 |
| 6,707,404 B1 | * | 3/2004 | Yilmaz ........................ | 341/120 |

OTHER PUBLICATIONS

Getting 14-Bit Performance from a 32-Channel 14-Bit String DAC, by: Albert O'Grady, Analog Dialogue 37-02 (2003).

* cited by examiner

Primary Examiner—Peguy JeanPierre
Assistant Examiner—Joseph Lauture
(74) Attorney, Agent, or Firm—W. Daniel Swayze, Jr.; W. James Brady; Frederick J. Telecky, Jr.

(57) ABSTRACT

A segmented string digital-to-analog converter (DAC) comprises least significant bits (LSB subword) interpolation circuitry. The LSB subword interpolation circuitry defines, for each input digital word (or code), an offset voltage representative of an M bit LSB subword of the input digital word. The offset voltage modifies a coarse analog representation voltage of an N bit most significant bits (MSB subword) of the input digital word. The LSB subword interpolation circuitry includes a coarse analog representative voltage input, an LSB subword input, an LSB modification circuit, an offset voltage defining circuit, and a summation device. The DAC further includes a segmented string and a coarse level device connected to tap points of the segmented string. The offset voltage defining circuit receives an LSB subword and defines an offset voltage for modifying the corresponding coarse analog representative voltage. Such an offset voltage is defined based on a given modified LSB subword. The LSB modification circuit modifies the given LSB subword received via the LSB subword input, to create the given modified LSB subword. By modifying the LSB subword, errors introduced due to variations in the upper tap and lower tap voltage levels can be mitigated.

13 Claims, 6 Drawing Sheets

10 BIT STRING, 6 BIT INTERP. DAC (EFFECTIVE RESOLUTION 16 BITS)

INTEGRAL NONLINEARITY ERROR CORRECTION FOR INTERPOLATING STRING DAC

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates to string digital-to-analog converters (string DACs) and associated interpolation circuits. Other aspects of the invention relate to circuitry and to techniques for calibrating interpolation string DACs to correct integral nonlinearity (INL) errors.

Monotonicity and low INL are usually required in applications in which DACs, including string DACs, are used. The INL error is the difference between the actual output of a. DAC and an "ideal" output of the DAC.

A string DAC is a type of static DAC that includes a plurality of resistors connected in series between a high reference voltage and a low reference voltage, wherein the various connecting nodes between the resistors constitute tap points that are selectively switched to an output node in response to a digital input. The voltage of the tap point is selectively switched to an output node, and is an inherently monotonic analog representation of the digital input. For an N-bit DAC, $2^{N-1}$ tap point voltage levels are required, so $2^N$ resistors are required for a string DAC. This number of resistors is too large to be practical for more than approximately eight to ten bits, unless the DAC is segmented into a string DAC section and an interpolation DAC section, in which case the interpolation section also must be inherently monotonic to ensure that the entire DAC is monotonic.

SUMMARY OF THE INVENTION

There is a need for a new manner of calibrating the INL of a string DAC, to mitigate the INL introduced by the interpolation DAC. In accordance with one aspect of the invention, a segmented string digital-to-analog converter (DAC) is provided which has least significant bits (LSB subword) interpolator and/or the string. The segmented string DAC may comprise a sub-micron CMOS DAC. The subword interpolation circuitry defines, for each input digital word (otherwise referred to as a code), an offset voltage representative of an LSB subword portion of the input digital word. The offset voltage modifies a coarse analog representation voltage of a most significant bits (MSB subword) portion of the input digital word.

The LSB subword interpolation circuitry comprises a coarse analog representation voltage input to receive, for each input digital word, a corresponding coarse analog representation voltage representative of a corresponding MSB subword portion. An LSB subword input receives an LSB subword portion of the input digital word. An offset voltage defining circuit receives modified versions of the subwords from the LSB subword input, and defines an offset voltage for modifying a coarse analog representation voltage of the MSB subword portion. A summation device adds an offset value representative of the offset voltage to a coarse analog value representative of the corresponding coarse analog representation voltage.

An LSB modification circuit is provided to modify a given LSB subword received via the LSB subword input, to create a given modified LSB subword. The offset voltage defining circuit receives the given modified LSB subword, and defines, based on the given modified LSB subword, an offset voltage for modifying the corresponding coarse analog representative voltage. This corrects errors introduced due to, e.g., variations in the values of the resistive elements of the string as well as errors introduced by the offset voltage defining circuit. Accordingly, this adjustment results in a reduction in the INL error.

Other aspects, features, and advantages of the present invention will be apparent from the Detailed Description that follows.

DESCRIPTION OF THE SEVERAL VIEWS OF THE DRAWINGS

The invention will be more fully understood by reference to the following Detailed Description of the invention in conjunction with the drawings, of which.

DETAILED DESCRIPTION OF THE INVENTION

Figure 1:
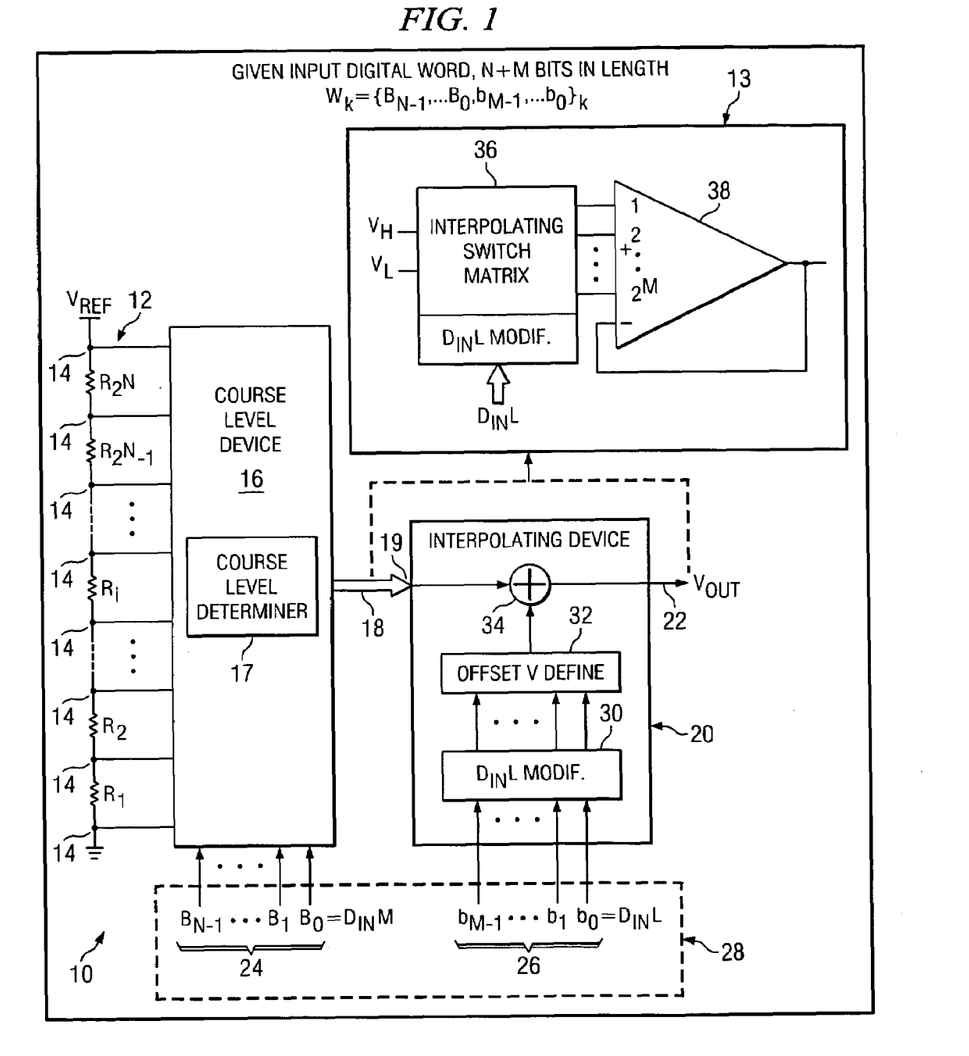
FIG. 1 is a schematic diagram of a segmented string DAC in accordance with one embodiment of the present invention.

Referring now to the drawings, FIG. 1 shows a segmented string DAC 10, in accordance with the illustrated embodiment of the invention. The illustrated segmented string DAC 10 may be implemented as part of a sub-micron CMOS DAC. The illustrated segmented string DAC 10 comprises a string 12, a coarse level device 16, and LSB subword interpolation circuitry 13. LSB subword interpolation circuitry 13 defines, for each input digital word (otherwise referred to as a code) 28, an offset voltage representative of an M bit subword 26. The offset voltage modifies a coarse analog representation voltage of an N bit MSB subword 24.

Segmented string 12 comprises $2^N$ resistive elements R connected in series and $2^N+1$ tap points 14.

Coarse level device 16 is connected to tap points 14 of segmented string 12. Coarse level device 16 comprises an MSB subword input, receiving MSB subword 24, and a coarse level determiner 17 to determine, for a given input MSB subword 24, a corresponding coarse analog representative voltage representative of a level of the given input MSB subword. The corresponding coarse analog representative voltage is output at coarse level voltage output 18. In the illustrated embodiment, coarse level device 16 comprises a level detector (see, e.g., FIG. 4). The level detector outputs, for a given MSB subword, high and low voltage values $V_H$ and $V_L$ equal to the upper tap point voltage and the lower tap point voltage corresponding to the level of the given MSB subword.

Coarse level voltage output 18 of coarse level device 16 is coupled to a coarse analog representative voltage input 19 of an interpolating device 20 of LSB subword interpolation circuitry 13. The coarse analog representative voltage input receives, for each input digital word, a corresponding coarse analog representative voltage representative of a level of a corresponding MSB subword. In the illustrated embodiment, coarse analog representative voltage input 19 receives, for each input digital word, corresponding voltages $V_H$ and $V_L$ representative of the corresponding upper and lower tap points. LSB subword interpolation circuitry 13 further comprises an LSB subword input, of interpolating device 20, to receive for each input digital word a corresponding LSB subword 26.

Interpolating device 20 comprises an LSB modification circuit 30 (otherwise referred to in the illustrated embodiment as a DinL modification circuit). This circuit modifies a given LSB subword 26 received via the LSB subword input, to create a given modified LSB subword. An offset voltage define circuit 32 is provided, which receives the given modified LSB subword, and defines, based on the given modified LSB subword, an offset voltage for modifying the corresponding coarse analog representative voltage. The offset voltage is input to a summation device 34, which also receives a coarse analog value representative of the coarse analog representative voltage at input 19, and outputs the sum of these values at $V_{OUT}$ 22 of interpolating device 20.

Interpolating device 20 may be implemented in the form of an interpolation switch matrix 36 connected to an averaging device 38. The illustrated averaging device 38 comprises $2^M$ inputs. The illustrated interpolation switch matrix 36 receives the values $V_H$ and $V_L$ and switches one of $V_H$ and $V_L$ to select inputs of averaging device 38. More specifically, in accordance with the input DinL, modified to be $DinL_{mod}$, a number of the inputs of the averaging device 38 corresponding to the decimal equivalent of $DinL_{mod}$ will be coupled to $V_H$, while the remaining inputs of averaging device 38 are coupled to $V_L$. This results in averaging device 38 averaging the collective values input thereto to produce an interpolated version of the coarse analog value representative of the corresponding coarse analog representative voltage, to now represent the LSB subword portion in the output representation of the input digital word.

Figure 2:
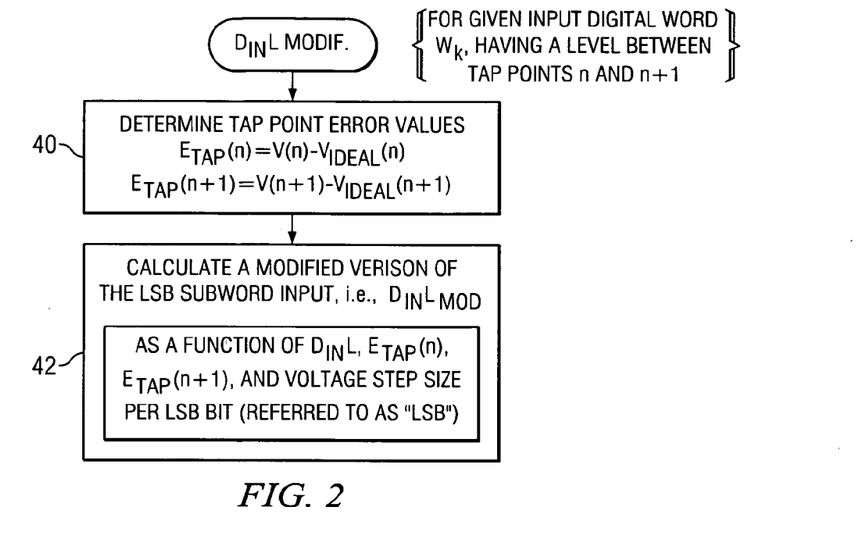
FIG. 2 is a flow chart of a process to determine a modified version of an LSB subword portion of a given input digital word.

FIG. 2 is a flow chart of a process to determine a modified version of the LSB subword portion of a given input digital word. In a first step 40, a determination is made as to the tap point error values. Specifically, a tap point error determination circuit determines an upper tap point error $E_{tap}(n+1)$ for an upper tap corresponding to the given MSB subword, and a lower tap point error $E_{tap}(n)$ for a lower tap corresponding to the given subword. As illustrated in step 40 in FIG. 2, these values can be calculated using the following equations:

$$E_{tap}(n) = V(n) - V_{IDEAL}(n)$$

$$E_{tap}(n+1) = V(n+1) - V_{IDEAL}(n+1)$$

In a next step 42, a calculation is made regarding a modified version of the LSB subword input, i.e., $DinL_{mod}$ (this calculation may effectively modify the MSB subword as well—see equations 5 and 6 below). This value is calculated as a function of DinL, $E_{tap}(n)$, $E_{tap}(n+1)$, and a voltage step size per LSB bit (sometimes referred to as an "LSB").

Figure 3:
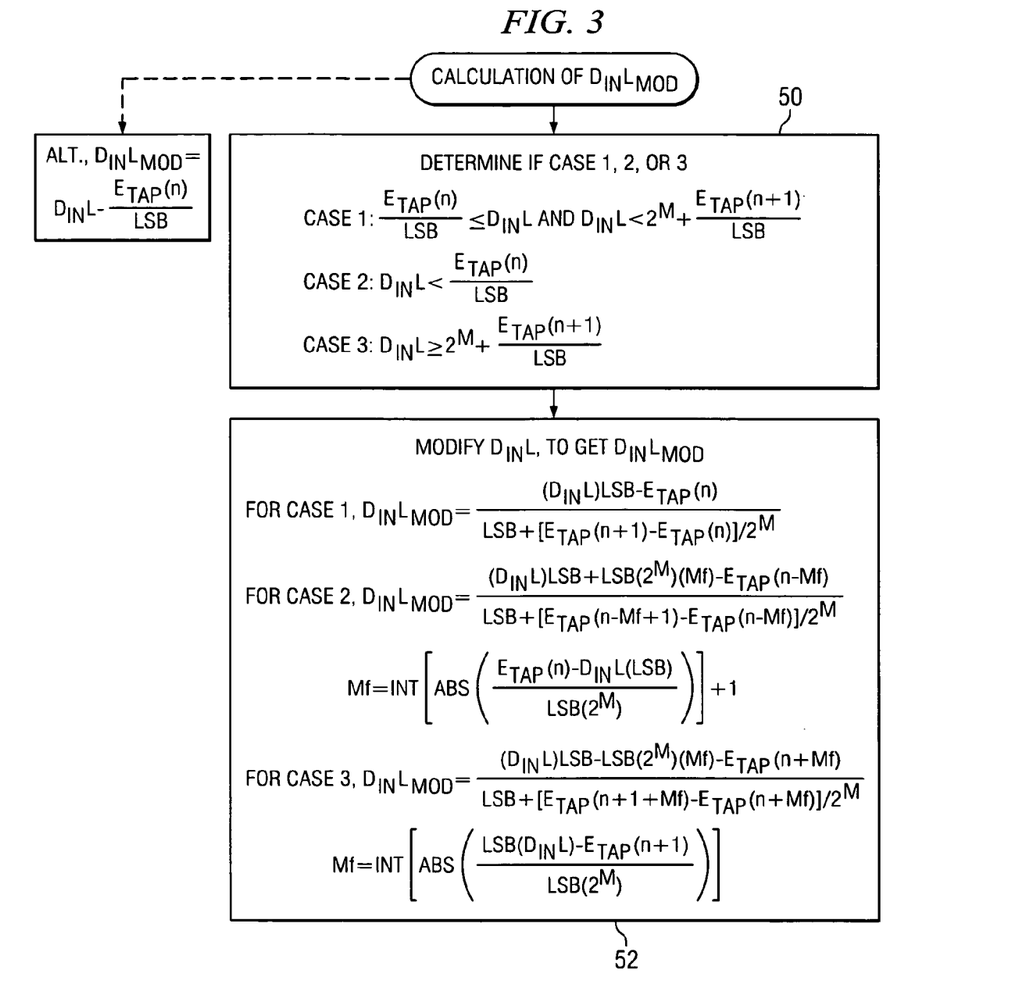
FIG. 3 is a flow chart showing example equations to calculate the modified LSB subword portion.

FIG. 3 is a flow chart of an example process for calculating the modified LSB subword $DinL_{mod}$, per step 42 of the process in FIG. 2.

In a first step 50, a determination is made as to whether one of a plurality of cases applies. Specifically, a determination is made as to which of three cases is satisfied by the given LSB subword DinL. These cases are set forth and identified as case 1, case 2, and case 3, hereinbelow.

In a next step 52, DinL is modified, to get $DinL_{mod}$, in accordance with the determined case. The equations for performing this modification are set forth below, i.e., see equations 4 (for case 1), 5 (for case 2), and 6 (for case 3).

Figure 4:
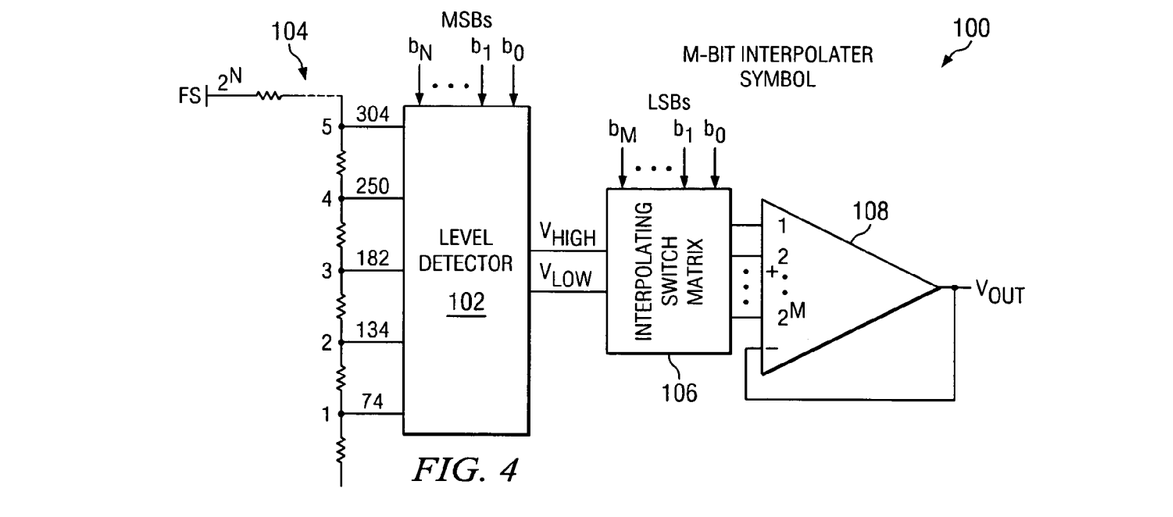
FIG. 4 is a schematic diagram of an exemplary segmented string DAC.

FIG. 4 shows portion of an example segmented string DAC 100. The illustrated DAC 100 comprises a level detector 102 connected to portions of a string 104. $V_{high}$ and $V_{low}$ outputs of level detector 102 are input to an interpolating switch matrix 106. The output of interpolating switch matrix 106 is coupled to the input terminals of an averaging device 108. String 104, level detector 102, interpolating switch matrix 106, and averaging device 108 function as do the corresponding elements described above with respect to FIG. 1.

FIG. 4 shows an n-bit interpolating string DAC (n=N+M). The illustrated DAC topology uses a coarse string DAC followed by a fine DAC (interpolation DAC). A digital input word (Din) is partitioned into two pieces such that n=M+N. N most significant bits form N-bit MSBs (DinM), and M least significant bits form M-bit LSBs (DinL). The coarse DAC determines two levels ($V_{high}$ and $V_{low}$) from the string based on the MSBs of the digital input. An interpolation DAC interpolates the levels between $V_{high}$ and $V_{low}$ based on the LSBs of the digital inputs. Some of the interpolation will be explained as follows.

For an N=10-bit string and an M=6-bit interpolator, assume that FS is equal to $2^{(N+M)}$ units. String tap numbers are shown in FIG. 4 (from 1, 2, 3, to $2^N$) and tap voltage values (74, 134, 182, 250, 304 units) are shown to right of the tap numbers.

In general, an n-bit interpolating string DAC output is given by the following equation.

$$V_{out} = V_{low} + DinL \frac{V_{high} - V_{low}}{2^M} \quad \text{(eq.1)}$$

where DinL is the LSBs of the Din. Equation 1 can be written in terms of tap ideal voltages (for tap points $V_{lowide}$ and $V_{highide}$ and tap error values $E_{low}$ and $E_{high}$):

$$V_{out} = V_{lowide} + DinL \frac{V_{highide} - V_{lowide}}{2^M} + \left( E_{tap}(n) + DinL \frac{E_{tap}(n+1) - E_{tap}(n)}{2^M} \right)$$

or equation can be written as follows $$V_{out} = V_{outide} + \left( E_{tap}(n) + DinL \frac{E_{tap}(n+1) - E_{tap}(n)}{2^M} \right) \quad \text{(Eq. 2)}$$

$E_{tap}(n)$ is the tap point error for $V_{low}$ that is founded based on the N-bit MSBs and $E_{tap}(n+1)$ tap point error for $V_{high}$, which is the next string tap point from $V_{low}$. From the equation, one can see that any string tap voltage error on $V_{low}$ will be reflected at the output, and the difference between $E_{tap}(n+1)$ and $E_{tap}(n)$ will be interpolated.

For a 16-bit DAC with a 10-bit string followed by a 6-bit interpolator, several values of the interpolated string DAC output will now be calculated. Here, tap points 2 and 3 are chosen based on the 10-bit MSBs of the input digital codes. For simplification, the LSB value is assumed to be one (LSB=FS/$2^{(M+N)}$=1; FS is the full scale value of the DAC; for LSB to be one FS must be $2^{M+N}$). Based on these values, $E_{tap}(2)$=Vlow−Vlowide=134−128=6, and $E_{tap}(3)$=Vhigh−Vhighide=182−192=−10. Based on equation 2, table 2 can be tabulated for some codes.

TABLE 1

DAC Uncalibrated to Mitigate INL

| Din | DinL | Vlowide | Vhighide | Vlow | Vhigh | Vout | Voutide | Vouterr |
|---|---|---|---|---|---|---|---|---|
| 128 | 0 | 128 | 192 | 134 | 182 | 134 | 128 | 6 |
| 129 | 1 | 128 | 192 | 134 | 182 | 134.75 | 129 | 5.75 |
| 130 | 2 | 128 | 192 | 134 | 182 | 135.5 | 130 | 5.5 |
| 131 | 3 | 128 | 192 | 134 | 182 | 136.25 | 131 | 5.25 |
| 132 | 4 | 128 | 192 | 134 | 182 | 137 | 132 | 5 |
| 133 | 5 | 128 | 192 | 134 | 182 | 137.75 | 133 | 4.75 |
| 134 | 6 | 128 | 192 | 134 | 182 | 138.5 | 134 | 4.5 |
| 135 | 7 | 128 | 192 | 134 | 182 | 139.25 | 135 | 4.25 |
| 136 | 8 | 128 | 192 | 134 | 182 | 140 | 136 | 4 |
| 137 | 9 | 128 | 192 | 134 | 182 | 140.75 | 137 | 3.75 |
| 138 | 10 | 128 | 192 | 134 | 182 | 141.5 | 138 | 3.5 |
| 139 | 11 | 128 | 192 | 134 | 182 | 142.25 | 139 | 3.25 |
| 140 | 12 | 128 | 192 | 134 | 182 | 143 | 140 | 3 |
| 141 | 13 | 128 | 192 | 134 | 182 | 143.75 | 141 | 2.75 |
| 179 | 51 | 128 | 192 | 134 | 182 | 172.25 | 179 | −6.75 |
| 180 | 52 | 128 | 192 | 134 | 182 | 173 | 180 | −7 |
| 181 | 53 | 128 | 192 | 134 | 182 | 173.75 | 181 | −7.25 |
| 182 | 54 | 128 | 192 | 134 | 182 | 174.5 | 182 | −7.5 |
| 183 | 55 | 128 | 192 | 134 | 182 | 175.25 | 183 | −7.75 |
| 184 | 56 | 128 | 192 | 134 | 182 | 176 | 184 | −8 |
| 185 | 57 | 128 | 192 | 134 | 182 | 176.75 | 185 | −8.25 |
| 186 | 58 | 128 | 192 | 134 | 182 | 177.5 | 186 | −8.5 |
| 187 | 59 | 128 | 192 | 134 | 182 | 178.25 | 187 | −8.75 |
| 188 | 60 | 128 | 192 | 134 | 182 | 179 | 188 | −9 |
| 189 | 61 | 128 | 192 | 134 | 182 | 179.75 | 189 | −9.25 |
| 190 | 62 | 128 | 192 | 134 | 182 | 180.5 | 190 | −9.5 |
| 191 | 63 | 128 | 192 | 134 | 182 | 181.25 | 191 | −9.75 |

Where $V_{out}$ is the DAC output, $V_{outide}$ is the ideal DAC output, $V_{outerr} = V_{out} - V_{outide}$.

As one can see from the Table 1 above, without some sort of INL (integral non-linearity) correction, the interpolator output has several LSBs of error. There are several ways to correct these errors. One way is with pure digital calibration. In this method, the string tap errors are measured and stored in memory. Once these tap point errors are known, the input digital code is modified based on the tap point errors so that DAC output error is minimized. The ideal interpolator output based on the Eq. 1 can be written as follows $$V_{out} = V_{lowide} + DinL * LSB \quad \text{(Eq. 3)}$$

Where DinL is the interpolator code. For a calibrated DAC, the digital code is modified, such that the output of the interpolator has a minimized INL error. A modified code can be assumed for the DAC, and equation 2 can be rewritten replacing DinL with $DinL_{mod}$ $$V_{out} = V_{lowide} + DinL_{mod}\frac{V_{highide} - V_{lowide}}{2^M} + \left(E_{tap}(n) + DinL_{mod}\frac{E_{tap}(n+1) - E_{tap}(n)}{2^M}\right)$$

Now, equating the above equation to equation 3 and solving for $DinL_{mod}$, $$DinL_{mod} = \frac{DinL * LSB - E_{tap}(n)}{LSB + [E_{tap}(n+1) - E_{tap}(n)]/2^M} \quad \text{(Eq.4)}$$

By modifying the interpolator digital code of the DAC, some of the error in the DAC output may be corrected.

One needs to remember the following rule for an M-bit interpolator $$0 \leq DinL_{mod} < 2^M$$

This, equation suggests a need to divide equation 4 into three different cases based on the DinL, $E_{tap}(n+1)$, and $E_{tap}(n)$.

Case 1)

$$\frac{E_{tap}(n)}{LSB} \leq DinL \quad \text{and} \quad DinL < 2^M + \frac{E_{tap}(n+1)}{LSB}$$

This condition means that a minimum error at the DAC output can be obtained without changing current string tap points. In other words, $V_{low}$ and $V_{high}$ are not changed (which implies that the MSB subword has not changed). The modified interpolator code is simply obtained from equation 4.

Case 2)

$$DinL < \frac{E_{tap}(n)}{LSB}$$

In this case, one moves down on the string tap points (thereby effectively modifying the MSB subword) by as much as $$Mf = \text{int}\left(\text{abs}\left(\frac{E_{tap}(n) - DinL*LSB}{LSB*2^M}\right)\right) + 1$$

the modified code is $$DinL_{mod} = \frac{DinL*LSB + LSB*2^M*Mf - E_{tap}(n-Mf)}{LSB + [E_{tap}(n-Mf+1) - E_{tap}(n-Mf)]/2^M} \quad \text{(Eq.5)}$$

In this case, $V_{low}$ and $V_{high}$ are changed to new values based on Mf.

Case 3)

$$DinL \geq 2^M + \frac{E_{tap}(n+1)}{LSB}$$

In this case, one has to move up on the string tap points (thereby effectively modifying the MSB subword) by as much as $$Mf = \text{int}\left(\text{abs}\left(\frac{LSB*DinL - E_{tap}(n+1)}{LSB*2^M}\right)\right)$$

and the modified code is $$DinL_{mod} = \frac{[LSB*DinL - LSB*2^M*Mf - E_{tap}(n+Mf)]}{LSB + [E_{tap}(n+1+Mf) - E_{tap}(n+Mf)]/2^M} \quad \text{(Eq.6)}$$

In this case, $V_{low}$ and $V_{high}$ are changed to new values based on Mf.

If the above calibration algorithm is used for the string DAC shown in FIG. 4, output errors can significantly be reduced. The outputs are calculated for codes 128 through 191 for a 16-bit DAC with a 10-bit string followed by a 6-bit interpolator. These codes imply that taps 2 and 3 need to be selected. Due to errors on the tap points, the DAC codes need to be modified. Modification will result in all of the three cases.

Case 1). For codes 6 through 53 the interpolator code is modified by equation 4, and taps 2 and 3 are used ($E_{tap}(3) = -10$ and $E_{tap}(2) = 6$).

Case 2). For codes 0 through 5, since $$DinL = 0, 1, \ldots 5 < \frac{E_{low}(2)}{LSB} = 6,$$

one needs to move down on the string by $$Mf = \text{int}\left(\text{abs}\left(\frac{6 - (0 \ldots 6)}{2^6}\right)\right) + 1 = 1$$

The interpolator code is modified by equation 5, and the string tap voltages 1 and 2 are used ($E_{tap}(3-1) = 6$ and $E_{tap}(2-1) = 10$).

Case 3). For codes 54 through 63

$$DinL - \frac{E_{tap}(3)}{LSB} \geq 2^M$$

or $(54, 55, \ldots 63) - (-10) \geq 2^6$ one needs to move one tap up on the string tap, so string taps 4 and 3 are used for interpolation and the modified code equation 6 is used ($E_{tap}(2+1) = -10$ and $E_{tap}(3+1) = -6$)

TABLE 2

| | | | | LSB = 1 | | | | | | |
|---|---|---|---|---|---|---|---|---|---|---|
| Din | DinL | DinLmodR | DinLmod | Case | Vlowide | Vhighide | Vlow | Vhigh | Vout | Voutide | Vouterr |
| For codes 0–5 the case two equation is used. String tap points 2 and 1 are used | | | | | | | | | | | |
| 128 | 0 | 57.6 | 57 | 2 | 64 | 128 | 74 | 134 | 127.44 | 128 | −0.5625 |
| 129 | 1 | 58.66667 | 58 | 2 | 64 | 128 | 74 | 134 | 128.38 | 129 | −0.625 |
| 130 | 2 | 59.73333 | 59 | 2 | 64 | 128 | 74 | 134 | 129.31 | 130 | −0.6875 |
| 131 | 3 | 60.8 | 60 | 2 | 64 | 128 | 74 | 134 | 130.25 | 131 | −0.75 |
| 132 | 4 | 61.86667 | 61 | 2 | 64 | 128 | 74 | 134 | 131.19 | 132 | −0.8125 |
| 133 | 5 | 62.93333 | 62 | 2 | 64 | 128 | 74 | 134 | 132.13 | 133 | −0.875 |
| Since the big errors can be corrected with current taps for codes 6–53 there is no need to change the current string taps. Sting taps 3 and 2 are used for the interpolation. | | | | | | | | | | | |
| 134 | 6 | 0 | 0 | 1 | 128 | 192 | 134 | 182 | 134 | 134 | 0 |
| 135 | 7 | 1.333333 | 1 | 1 | 128 | 192 | 134 | 182 | 134.75 | 135 | −0.25 |
| 136 | 8 | 2.666667 | 2 | 1 | 128 | 192 | 134 | 182 | 135.5 | 136 | −0.5 |
| 137 | 9 | 4 | 4 | 1 | 128 | 192 | 134 | 182 | 137 | 137 | 0 |
| 138 | 10 | 5.333333 | 5 | 1 | 128 | 192 | 134 | 182 | 137.75 | 138 | −0.25 |
| 139 | 11 | 6.666667 | 6 | 1 | 128 | 192 | 134 | 182 | 138.5 | 139 | −0.5 |
| 140 | 12 | 8 | 8 | 1 | 128 | 192 | 134 | 182 | 140 | 140 | 0 |
| | | | | | | | | | | | 0 |

TABLE 2-continued

LSB = 1

| Din | DinL | DinLmodR | DinLmod | Case | Vlowide | Vhighide | Vlow | Vhigh | Vout | Voutide | Vouterr |
|---|---|---|---|---|---|---|---|---|---|---|---|
| 179 | 51 | 60 | 60 | 1 | 128 | 192 | 134 | 182 | 179 | 179 | 0 |
| 180 | 52 | 61.33333 | 61 | 1 | 128 | 192 | 134 | 182 | 179.75 | 180 | −0.25 |
| 181 | 53 | 62.66667 | 62 | 1 | 128 | 192 | 134 | 182 | 180.5 | 181 | −0.5 |
| | | | For Codes 54–63 the code is modified according to case 3. One needs to move up by 1 on string, so taps 4 and 3 are used. | | | | | | | | |
| 182 | 54 | 0 | 0 | 3 | 192 | 256 | 182 | 250 | 182 | 182 | 0 |
| 183 | 55 | 0.941176 | 0 | 3 | 192 | 256 | 182 | 250 | 182 | 183 | −1 |
| 184 | 56 | 1.882353 | 1 | 3 | 192 | 256 | 182 | 250 | 183.06 | 184 | −0.9375 |
| 185 | 57 | 2.823529 | 2 | 3 | 192 | 256 | 182 | 250 | 184.13 | 185 | −0.875 |
| 186 | 58 | 3.764706 | 3 | 3 | 192 | 256 | 182 | 250 | 185.19 | 186 | −0.8125 |
| 187 | 59 | 4.705882 | 4 | 3 | 192 | 256 | 182 | 250 | 186.25 | 187 | −0.75 |
| 188 | 60 | 5.647059 | 5 | 3 | 192 | 256 | 182 | 250 | 187.31 | 188 | −0.6875 |
| 189 | 61 | 6.588235 | 6 | 3 | 192 | 256 | 182 | 250 | 188.38 | 189 | −0.625 |
| 190 | 62 | 7.529412 | 7 | 3 | 192 | 256 | 182 | 250 | 189.44 | 190 | −0.5625 |
| 191 | 63 | 8.470588 | 8 | 3 | 192 | 256 | 182 | 250 | 190.5 | 191 | −0.5 |

Figure 5:
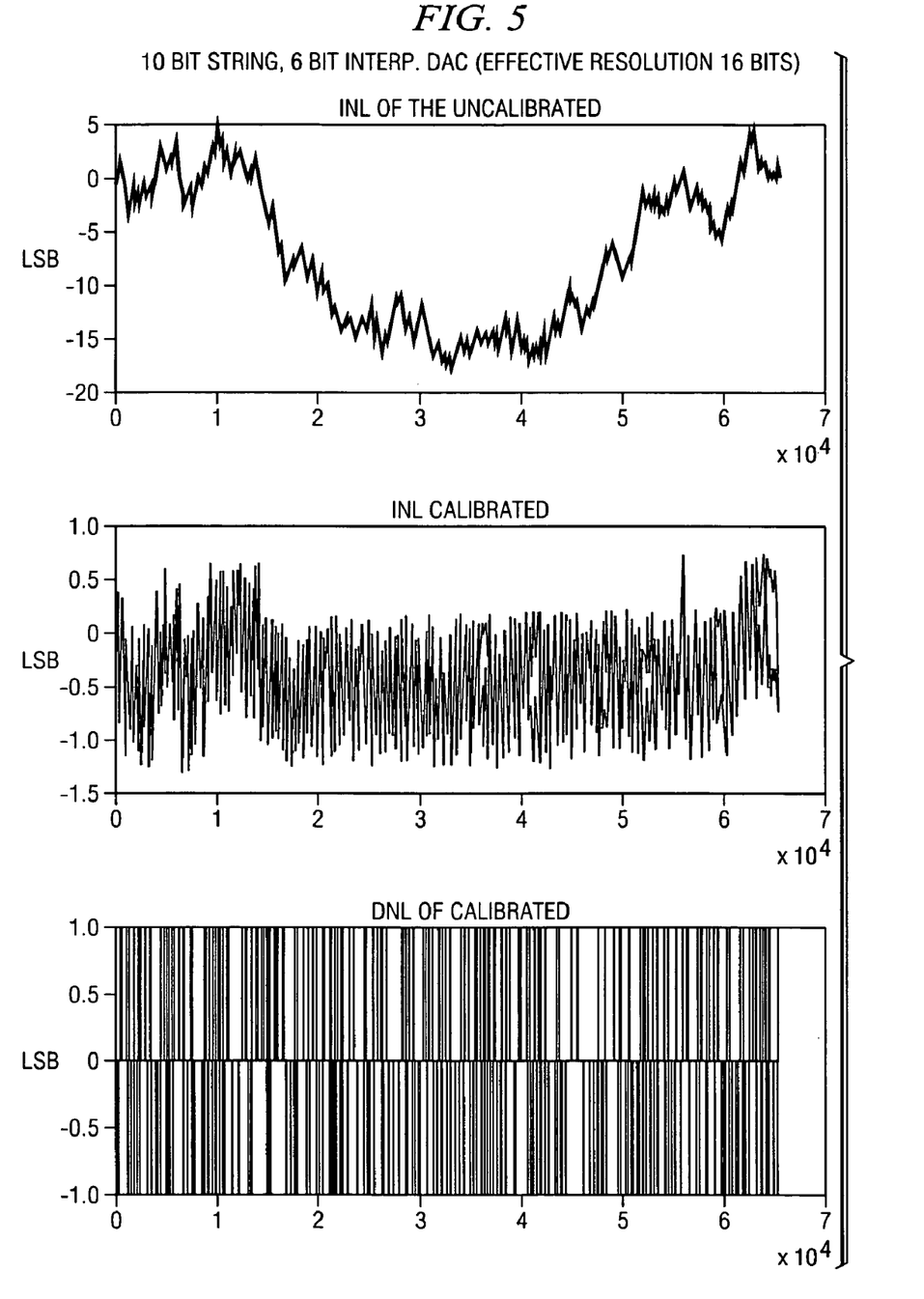
FIGS. 5, 6, and 7 are waveforms of the results of system simulations for various cases described in the Detailed Description below.

As equation 4, 5, and 6 imply, $DinL_{mod}$ is represented in terms of a real value, shown in table 2 as $DinL_{modR}$. However, an integer value is needed. In Table 2, codes 182 and 183 result in the same modified code, which results in same output voltage. This means that the output voltage will not be increased even though the input code is increased, which results in a missing output value at the DAC output. Therefore, an INL of −1 means that the DAC output did not increase even though the digital code increased. This may be called a missing output value. The result of a simulation for this case are represented in FIG. 5.

Figure 6:
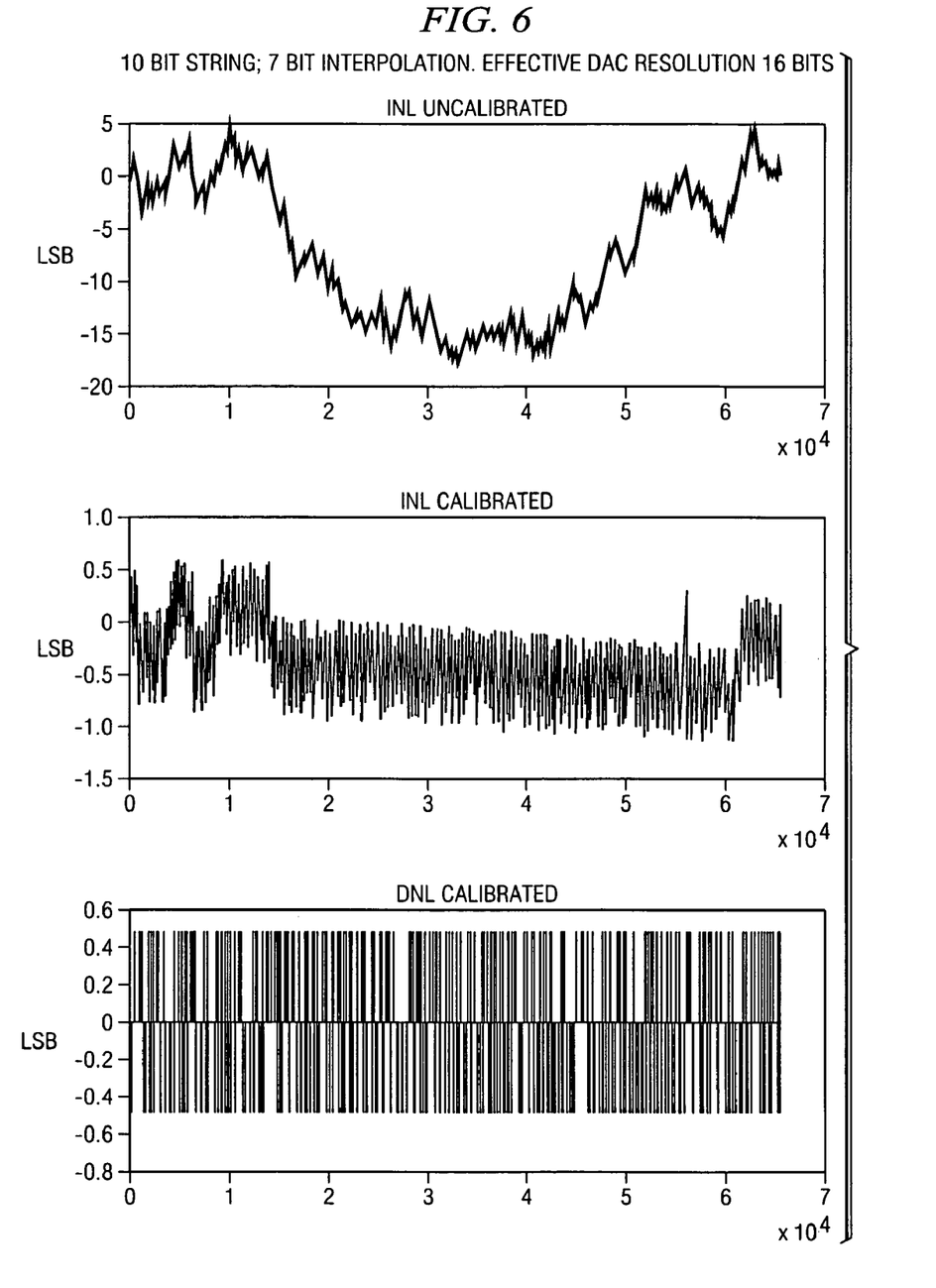

If the interpolator resolution can be increased by 1 or 2 bits, these so-called missing DAC output values can be calibrated. With the method of digital calibration described in this embodiment, instead of truncating the $DinL_{modR}$ values to integer values, one can make use of the decimal portion of the $DinL_{modR}$ values. In the interpolator, one of the 1-bit gm stages can be divided into two pieces, to create half unit cell interpolator cells. See, e.g., U.S. Pat. No. 6,246,351, the content of which is hereby expressly incorporated herein by reference in its entirety. This allows the decimal portion of $DinL_{modR}$ to be utilized. If the decimal portion is greater than 0.5, one of the divided gm cells is used. System simulation for this case is shown in FIG. 6.

Figure 7:
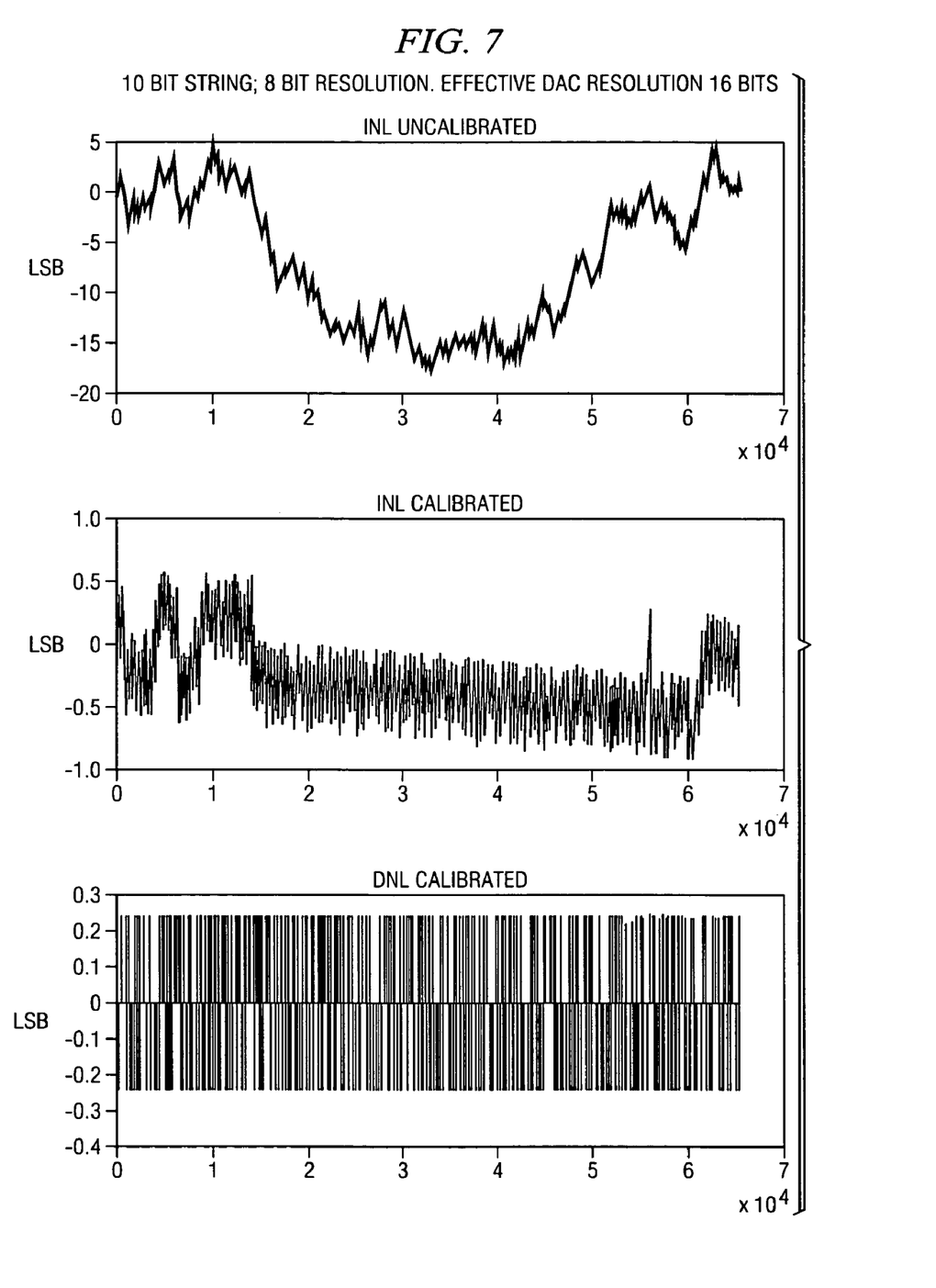

The same idea can be extended for an extra 2-bit case. System simulation for this is shown in FIG. 7. The difference between when no extra bits are used and when 1 or 2 extra bits are used is clear. Extra bits bring down the INL to between +−1.

Equations 4, 5, and 6 can be carried out with a digital multiplier and digital adder. When $E(n)-E(n-1)<LSB$ for $n=1 \ldots 2^N$ and $2^M \gg 1$, then equations 4, 5, and 6 can be reduced to just equation 4.

$$DinL_{mod} = \frac{DinL * LSB - E_{tap}(n)}{LSB + [E_{tap}(n+1) - E_{tap}(n)]/2^M} \cong \frac{DinL * LSB - E_{tap}(n)}{LSB + LSB/2^M} \cong$$

$$\frac{DinL * LSB - E_{tap}(n)}{LSB} \cong DinL - \frac{E_{tap}(n)}{LSB}$$

(Eq. 7)

Equation 7 implies that the digital calibration can be carried out with an addition operation, if the $E_{tap}(n)/LSB$ stored in memory rather than $E_{tap}(n)$. This simplifies the implementation of the calibration.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. Apparatus comprising LSB (least significant bit) subword interpolation circuitry that defines, for each input digital word, an offset voltage representative of an M bit LSB subword of the input digital word, the offset voltage modifying a coarse analog representation voltage of an N bit MSB (most significant bit) subword of the input digital word, the LSB subword interpolation circuitry comprising:
   a coarse analog representative voltage input to receive for each input digital word a corresponding coarse analog representative voltage representative of a level of a corresponding MSB subword;
   an LSB subword input to receive for each input digital word a corresponding LSB subword;
   an LSB modification circuit to modify a given LSB subword received via the LSB subword input, to create a given modified LSB subword;
   an offset voltage defining circuit to receive the given modified LSB subword, and to define, based on the given modified LSB subword, an offset voltage for modifying the corresponding coarse analog representative voltage; and
   a summation device to add an offset value representative of the offset voltage to a coarse analog value representative of the corresponding coarse analog representative voltage.

2. The apparatus according to claim 1, further comprising:
   a segmented string comprising $2^N$ resistive elements connected in series and $2^N+1$ tap points;
   a coarse level device connected to the tap points of the segmented string, the coarse level device comprising an MSB subword input and a coarse level determiner to determine, for a given input MSB subword, a corresponding coarse analog representative voltage representative of a level of the given input MSB subword.

3. The apparatus according to claim 2, wherein the coarse level device comprises a level detector.

4. The apparatus according to claim 3, wherein the level detector comprises an output to output for a given MSB subword high and low voltage values $V_H$ and $V_L$ equal to the upper tap point and the lower tap point corresponding to the level of the given MSB subword.

5. The apparatus according to claim 4, wherein the offset voltage defining circuit and the summation device collectively comprise an interpolation switch matrix and an averaging device having a plurality of inputs, the interpolation switch matrix receiving $V_H$ and $V_L$ and switching one of $V_H$ and $V_L$ to select ones of the averaging device inputs.

6. The apparatus according to claim 4, wherein the LSB modification circuit comprises a tap point error determining circuit to determine an upper tap point error $E_{tap}(n+1)$ for an upper tap corresponding to the given MSB subword and a lower tap point error $E_{tap}(n)$ for a lower tap corresponding to the given MSB subword.

7. The apparatus according to claim 6, wherein the LSB modification circuit further comprises a calculation portion to calculate the given modified LSB subword as a function of the given LSB subword, the upper and lower tap point errors, and the voltage step size between $V_L$ and $V_H$ per LSB bit.

8. The apparatus according to claim 7, wherein the calculation portion of the LSB modification circuit comprises:
  a case determining circuit to determine which of the following cases applies:

Case 1: $\frac{E_{tap}(n+1)}{LSB} \leq DinL \cdot and \cdot DinL < 2^m + \frac{E_{tap}(n+1)}{LSB}$ Case 2: $DinL < \frac{E_{tap}(n+1)}{LSB}$ Case 3: $DinL \geq 2^m + \frac{E_{tap}(n+1)}{LSB}$ and a case-specific modification circuit to modify the given LSB subword in accordance with the determined case, as follows:

For case 1,
  $$DinL_{mod} = \frac{(DinL)LSB - E_{tap}(n)}{LSB + [E_{tap}(n+1) - E_{tap}(n)]/2^M}$$

For case 2,
  $$DinL_{mod} = \frac{(DinL)LSB + LSB(2^M)(Mf) - E_{tap}(n - Mf)}{LSB + [E_{tap}(n - Mf + 1) - E_{tap}(n - Mf)]/2^m}$$

$$Mf = \text{int}\left[\text{abs}\left(\frac{E_{tap}(n) - DinL(LSB)}{LSB(2^M)}\right)\right] + 1$$

For case 3,
  $$DinL_{mod} = \frac{(DinL)LSB - LSB(2^M)(Mf) - E_{tap}(n + Mf)}{LSB + [E_{tap}(n + 1 + Mf) - E_{tap}(n + Mf)]/2^M}$$

$$Mf = \text{int}\left[\text{abs}\left(\frac{LSB(DinL) - E_{tap}(n+1)}{LSB(2^M)}\right)\right].$$

9. The apparatus according to claim 1, wherein the LSB modification circuit comprises a tap point error determining circuit to determine an upper tap point error $E_{tap}(n+1)$ for an upper tap corresponding to the given MSB subword and a lower tap point error $E_{tap}(n)$ for a lower tap corresponding to the given LSB subword.

10. The apparatus according to claim 9, wherein the LSB modification circuit further comprises a calculation portion to calculate the given modified LSB subword as a function of the given LSB subword, the upper and lower tap point errors, and the voltage step size between $V_L$ and $V_H$ per LSB bit.

11. The apparatus according to claim 10, wherein the calculation portion of the LSB modification circuit comprises:
  a case determining circuit to determine which of the following cases applies:

Case 1: $\frac{E_{tap}(n)}{LSB} \leq DinL$ and $DinL < 2^m + \frac{E_{tap}(n+1)}{LSB}$ Case 2: $DinL < \frac{E_{tap}(n+1)}{LSB}$ Case 3: $DinL \geq 2^m + \frac{E_{tap}(n+1)}{LSB}$ and a case-specific modification circuit to modify the given LSB subword in accordance with the determined case, as follows:

For case 1,
  $$DinL_{mod} = \frac{(DinL)LSB - E_{tap}(n)}{LSB + [E_{tap}(n+1) - E_{tap}(n)]/2^M}$$

For case 2,
  $$DinL_{mod} = \frac{(DinL)LSB + LSB(2^M)(Mf) - E_{tap}(n - Mf)}{LSB + [E_{tap}(n - Mf + 1) - E_{tap}(n - Mf)]/2^m}$$

$$Mf = \text{int}\left[\text{abs}\left(\frac{E_{tap}(n) - DinL(LSB)}{LSB(2^M)}\right)\right] + 1$$

For case 3,
  $$DinL_{mod} = \frac{(DinL)LSB - LSB(2^M)(Mf) - E_{tap}(n + Mf)}{LSB + [E_{tap}(n + 1 + Mf) - E_{tap}(n + Mf)]/2^M}$$

$$Mf = \text{int}\left[\text{abs}\left(\frac{LSB(DinL) - E_{tap}(n+1)}{LSB(2^M)}\right)\right].$$

12. The apparatus according to claim 1, wherein the LSB modification circuit comprises a tap point error determining circuit to determine a tap point error $E_{tap}(n)$ corresponding to the given MSB subword and a calculation portion to calculate the given modified LSB subword as $DinL_{mod} = DinL - E_{tap}(n)/LSB$.

13. An LSB (least significant bit) subword interpolation method that defines, for each input digital word, an offset voltage representative of an M bit LSB subword of the input digital word, the offset voltage modifying a coarse analog representation voltage of an N bit MSB (most significant bit) subword of the input digital word, the LSB subword interpolation method comprising:
  receiving for each input digital word a corresponding coarse analog representative voltage representative of a level of a corresponding MSB subword;
  receiving for each input digital word a corresponding LSB subword;
  modifying a given LSB subword to create a given modified LSB subword;

receiving the given modified LSB subword, and defining, based on the given modified LSB subword, an offset voltage for modifying the corresponding coarse analog representative voltage; and adding an offset value representative of the offset voltage to a coarse analog value representative of the corresponding coarse analog representative voltage.

* * * * *